(12) United States Patent
Mawatari

(10) Patent No.: US 11,027,360 B2
(45) Date of Patent: Jun. 8, 2021

(54) BONDED BODY AND METHOD FOR MANUFACTURING THE SAME

(71) Applicant: DENSO CORPORATION, Kariya (JP)

(72) Inventor: Kazuaki Mawatari, Kariya (JP)

(73) Assignee: DENSO CORPORATION, Kariya (JP)

( * ) Notice: Subject to any disclaimer, the term of this patent is extended or adjusted under 35 U.S.C. 154(b) by 120 days.

(21) Appl. No.: 16/545,116

(22) Filed: Aug. 20, 2019

(65) Prior Publication Data

US 2019/0375040 A1    Dec. 12, 2019

Related U.S. Application Data

(63) Continuation of application No. PCT/JP2018/005302, filed on Feb. 15, 2018.

(30) Foreign Application Priority Data

Mar. 3, 2017 (JP) .............................. JP2017-040671

(51) Int. Cl.
*B23K 11/11* (2006.01)
*H01L 23/00* (2006.01)

(52) U.S. Cl.
CPC .............. *B23K 11/11* (2013.01); *H01L 24/03* (2013.01)

(58) Field of Classification Search
CPC .......... B23K 11/11; B23K 11/14; B23K 11/34; B23K 2101/40; H01L 24/03
See application file for complete search history.

(56) References Cited

U.S. PATENT DOCUMENTS

2013/0020301 A1    1/2013  Onose et al.

FOREIGN PATENT DOCUMENTS

| JP | H5-42374 A | 2/1993 |
| JP | 2014-032814 A | 2/2014 |
| JP | 2015-213938 A | 12/2015 |
| WO | 2018/116785 A1 | 6/2018 |

*Primary Examiner* — Robert G Bachner
(74) *Attorney, Agent, or Firm* — Posz Law Group, PLC

(57) ABSTRACT

A bonded body includes a first metal piece, a second metal piece, and a spacer. The first metal piece has a first surface and a protrusion protruding on the first surface. The second metal piece has a second surface, and the second surface of the second metal piece is bonded to the first surface of the first metal piece at the protrusion. The spacer has an electrically insulating property. The spacer is provided on the first surface of the first metal piece, and located between the first metal piece and the second metal piece. The first metal piece and the second metal piece are arranged to face each other such that a portion of the first surface of the first metal piece outside of the spacer is exposed from the second metal piece.

14 Claims, 3 Drawing Sheets

BONDED BODY AND METHOD FOR MANUFACTURING THE SAME

CROSS REFERENCE TO RELATED APPLICATIONS

The present application is a continuation application of International Patent Application No. PCT/JP2018/005302 filed on Feb. 15, 2018, which designated the U.S. and claims the benefit of priority from Japanese Patent Application No. 2017-040671 filed on Mar. 3, 2017. The entire disclosures of all of the above applications are incorporated herein by reference.

TECHNICAL FIELD

The present disclosure relates to a bonded body and a method for manufacturing the bonded body.

BACKGROUND

As a method for bonding metal pieces, a resistance welding has been known. In the resistance welding, metal pieces are melted and bonded to each other by Joule's heat, which is generated by an electric current flowing in the metal pieces. For example, the electric current is concentrated onto a protrusion of the metal piece so as to melt the protrusion, to thereby bond the metal pieces at the protrusion.

SUMMARY

The present disclosure describes a bonded body and a method for manufacturing the bonded body. A bonded body includes a first metal piece, a second metal piece, and a spacer. The first metal piece has a first surface and a protrusion protruding on the first surface. The second metal piece has a second surface, and the second surface of the second metal piece is bonded to the first surface of the first metal piece at the protrusion. The spacer has an electrically insulating property. The spacer is provided on the first surface of the first metal piece, and is arranged between the first metal piece and the second metal piece. The first metal piece and the second metal piece are arranged to face each other such that a portion of the first surface of the first metal piece outside of the spacer is exposed from the second metal piece.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
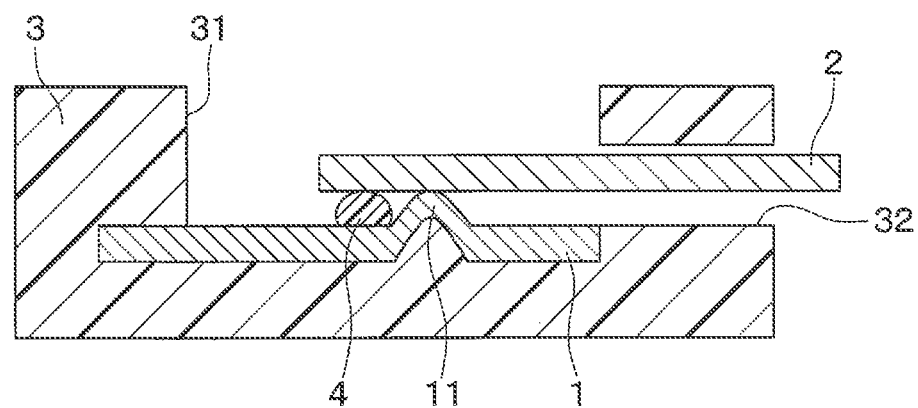
FIG. 1 is a diagram illustrating a cross-sectional view of a bonded body according to a first embodiment.

In a resistance welding in which an electric current is concentrated on a protrusion to melt the protrusion in order to bond metal pieces at the protrusion, if the metal pieces are in contact with each other in a region other than the protrusion, the electric current is dispersed, resulting in poor welding. Therefore, it is preferable that the metal pieces are separated from each other in the region other than the protrusion.

As an example of the resistance welding, it is known to cover one of two metal pieces with an insulating material in order to avoid the metal pieces from contacting with each other in the region other than the protrusion. Specifically, a first metal piece, which is one of the metal pieces and projects from a connector, has a protrusion at an end opposite to the connector, and a portion of the first metal piece adjacent to the connector is covered with an insulating material. A second metal piece, which is the other of the metal pieces, is arranged such that an end of the second metal piece overlaps with the portion of the first metal piece covered with the insulating material. As such, an end of the second metal piece is restricted from being in contact with the first metal piece.

Such a structure is effective to a direct-spot welding in which the two metal pieces are held between two electrodes on both sides in a stacking direction. On the other hand, if such a structure is employed to an indirect-spot welding in which electrodes are brought into contact with respective metal pieces on one side in the stacking direction of the two metal pieces, since the portion of the first metal piece, which is adjacent to the connector and is not overlapped with the second metal piece, is covered with the insulating material, an electric conduction is obstructed due to the insulating material. Therefore, the above described structure may not be used for the indirect-spot welding.

According to an aspect of the present disclosure, a bonded body includes a first metal piece and a second metal piece. The first metal piece has a first surface and a protrusion protruding on the first surface. The second metal piece has a second surface, and the second surface of the second metal piece is bonded to the first surface of the first metal piece at the protrusion. The bonded body further includes an electrically insulating spacer formed on the first surface of the first metal piece and arranged between the first metal piece and the second metal piece. The first metal piece and the second metal piece are arranged to face each other such that a portion of the first surface of the first metal piece outside of the spacer is exposed from the second metal piece.

In such a configuration, since the spacer is arranged between the first metal piece and the second metal piece, it is less likely that the first metal piece will be in contact with the second metal piece in a region other than the protrusion. Since the first metal piece is arranged such that the portion of the first surface, which is outside of the spacer, is exposed from the second metal piece, an electrode can be brought into contact with the exposed portion of the first surface of the first metal piece. Therefore, the configuration can be used to the indirect-spot welding.

According to another aspect of the present disclosure, a method is for manufacturing a bonded body in which a first surface of a first member to be welded is bonded to a second surface of a second member to be welded by a resistance welding. The method includes: forming a protrusion on the first surface of the first member; forming a spacer on the first surface of the first member, the spacer having an electrically insulating property; arranging the first member and the second member on top of another such that the second surface of the second member is in contact with the protrusion of the first member, the spacer is located between the first member and the second member, and a portion of the first surface of the first member outside of the spacer is exposed from the second member; and melting the protrusion by applying an electric current to the first member and the second member, so that the first member and the second member are bonded to each other at the protrusion melted.

In such a method, since the spacer is arranged between the first member and the second member, it is less likely that the first member and the second member will contact with each other in a region other than the protrusion. Further, since the first member is arranged such that the potion of the first member outside of the spacer is exposed from the second member, it is possible to perform an indirect-spot welding by bringing an electrode into contact with the exposed portion of the first surface of the first member exposed from the second member.

Hereinafter, embodiments of the present disclosure will be further described with reference to the drawings. In the following descriptions of the embodiments, the same or equivalent parts will be designated with the same reference numbers.

First Embodiment

A first embodiment will be described. A bonded body in which a metal piece 1 and a metal piece 2 are bonded to each other, as shown in FIG. 1 and a method for manufacturing the bonded body will be hereinafter described. The metal piece 1 is, for example, a lead of a connector that is connected to a semiconductor chip. The metal piece 1 is, for example, made of copper or the like and is plated with nickel. The metal piece 2 is, for example, a lead of a semiconductor chip provided with a pressure sensor or the like. The metal piece 2 is, for example, made of copper or the like and is plated with nickel, tin or gold.

The metal piece 1 is fixed to a connector case 3 made of a resin. The metal piece 2 is bonded to the metal piece 1 inside of the connector case 3. The metal piece 1 corresponds to a first metal piece, and a first member to be welded. The metal piece 2 corresponds to a second metal piece, and a second member to be welded.

The connector case 3 is formed with two openings, including a first opening 31 and a second opening 32. The first opening 31 is extended in a direction perpendicular to a front surface of the first metal piece 1. A portion of the first metal piece 1 exposed from the first opening 31 has a rectangular plate shape, and a back surface of the first metal piece 1 is supported on the connector case 3. The front surface of the first metal piece 1 corresponds to a first surface of the first metal piece 1, and a back surface of the first metal piece 1 corresponds to a second surface of the first metal piece 1.

The second opening 32 is extended in a direction parallel with the front surface of the first metal piece 1. The second opening 32 is open on an outer surface of the connector case 3, and on a side wall surface of the first opening 31. The second metal piece 2 is inserted from the second opening 32 into the first opening 31.

The exposed portion of the first metal piece 1 exposed from the first opening 31 is formed with a protrusion 11. The protrusion 11 is a portion to melt by Joule's heat as an electric current concentrates on the protrusion during a resistance welding. The first metal piece 1 and the second metal piece 2 are bonded to each other by the protrusion 11.

A spacer 4 is formed on the front surface of the first metal piece 1. The spacer 4 is made of an electrically insulating material. The spacer 4 restricts the first metal piece 1 and the second metal piece 2 from contacting with each other in a region other than the protrusion 11. The spacer 4 is arranged between the first metal piece 1 and the second metal piece 2. The spacer 4 is, for example, made of a resin or a ceramic adhesive.

The spacer 4 has a heat resistance temperature equal to or higher than the temperature to which a peripheral area of the protrusion 11 on the front surface of the first metal piece 1, in particular, a portion of the first metal piece 1 where the spacer 4 is formed reaches during the resistance welding. As such, it is less likely that the spacer 4 will be deformed by the resistance welding. During the resistance welding, the temperature of the protrusion 11 is higher than the peripheral area of the protrusion 11. Therefore, when the heat resistance temperature of the spacer 4 is, for example, set equal to or higher than a melting temperature of the protrusion 11, it is less likely that the spacer 4 will be deformed.

In addition, the height of the spacer 4, that is, the dimension of the spacer 4 in a thickness direction of the first metal piece 1 is equal to or less than the height of the melted protrusion 11.

Figure 2:
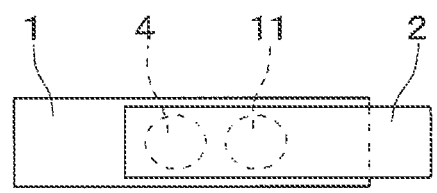
FIG. 2 is a diagram illustrating a plan view of the bonded body according to the first embodiment.

As shown in FIG. 2, the spacer 4 is formed into a shape of dot on the front surface of the first metal piece 1. The spacer 4 having such a shape can be formed by applying a material of the spacer 4 to the front surface of the first metal piece 1 in a circular region, and curing the material thereon. The height of the spacer 4 can be lowered by reducing the diameter of the circular region. Note that, in FIG. 2, illustration of the connector case 3 is omitted.

Also, the diameter of the region to which the material is applied and the height of the spacer 4 can be controlled by the viscosity or the thixotropic index of the material. Further, the spacer 4 can be formed by applying a material for many times, so that the spacer 4 is made of plural layers each formed by applying and curing the material. Thus, the height of the spacer 4 can be controlled according to the height (thickness) of each layer and the number of layers.

The protrusion 11 and the spacer 4 are aligned in a longitudinal direction of the portion of the first metal piece 1 exposed from the first opening 31. The portion of the second metal piece 2 bonded to the first metal piece 1 inside of the connector case 3 has a rectangular plate shape. The second metal plate 2 is arranged such that a longitudinal direction of the portion having the rectangular plate shape coincides with the longitudinal direction of the first metal piece 1. The first metal piece 1 and the second metal piece 2 are arranged to face each other across the spacer 4. The back surface of the second metal piece 2 is bonded to the protrusion 11.

In the present embodiment, the entirety of the spacer 4 is arranged between the first metal piece 1 and the second metal piece 2. However, the area where the spacer 4 is formed is at least outside of a region where a sub electrode 6, which will be described later, contacts. Thus, a portion of the spacer 4 may be exposed from the second meal piece 2.

A method for manufacturing the bonded body of the present embodiment will be described with reference to FIGS. 3A to 3D. In a step shown in FIG. 3A, a protrusion 11 is formed on a front surface of the first metal piece 1 by pressing. In a step shown in FIG. 3B, an electrically insulating material is applied in a form of dot in a region outside of the protrusion 11 on the front surface of the first metal piece 1 using a jet dispenser or the like, to thereby form the spacer 4. In this case, the spacer 4 is formed such that the height Ta at this time is equal to or lower than the height Tb of the protrusion 11 after being melted in a step shown in FIG. 3D. Thereafter, a connector case 3 is formed by an insert molding, so that the first metal piece 1 is fixed to the connector case 3. Alternatively, the spacer 4 may be formed by applying a resin onto the front surface of the first metal piece 1 inside of the first opening 31, after the connector case 3 is formed and the first metal piece 1 is fixed to the connector case 3.

Figure 3A:
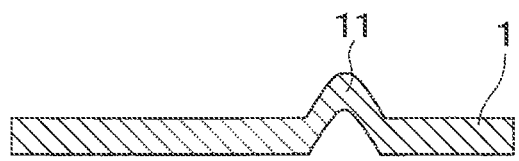
FIG. 3A is a diagram illustrating a cross-sectional view of a step of a manufacturing process of the bonded body according to the first embodiment.
Figure 3B:
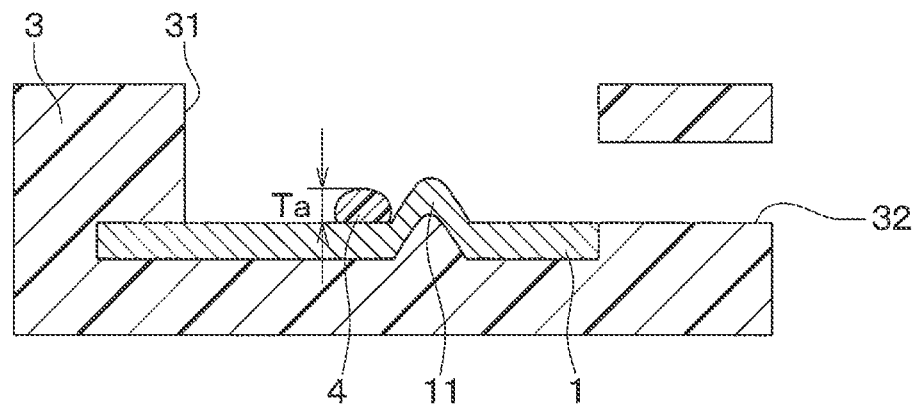
FIG. 3B is a diagram illustrating a cross-sectional view of a step of the manufacturing process of the bonded body subsequent to the step shown in FIG. 3A.
Figure 3C:
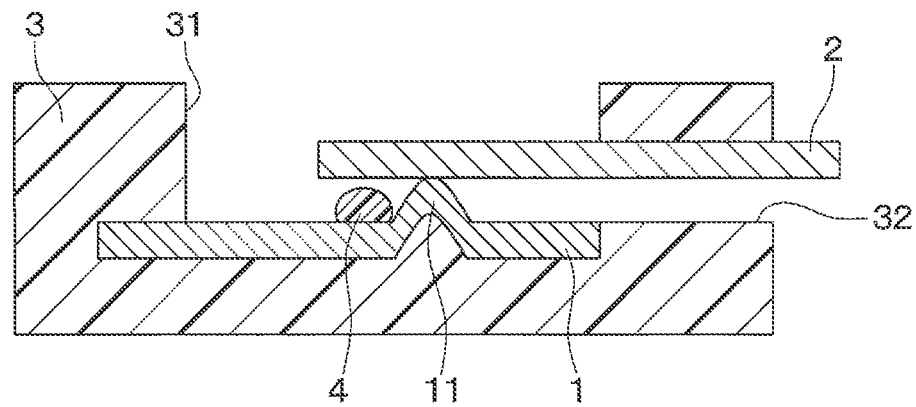
FIG. 3C is a diagram illustrating a cross-sectional view of a step of the manufacturing process of the bonded body subsequent to the step shown in FIG. 3B.

In a step shown in FIG. 3C, the second metal piece 2 is inserted into the second opening 32 from the outside of the connector case 3, and is laid on the first metal piece 1. In this case, the back surface of the second metal piece 2 is brought into contact with the protrusion 11, and the spacer 4 is positioned between the first metal piece 1 and the second metal piece 2. Also, the portion of the front surface of the first metal piece 1 outside of the spacer 4 is exposed from the second metal piece 2. Specifically, the first metal piece 1 and the second metal piece 2 are arranged such that a portion of the first metal piece 1 on which the protrusion 11 and the spacer 4 are formed in the longitudinal direction and an end of the second metal piece 2 in the longitudinal direction are opposed to each other. Thus, the other portion of the first metal piece 1 in the longitudinal direction is exposed from the second metal piece 2.

Figure 3D:
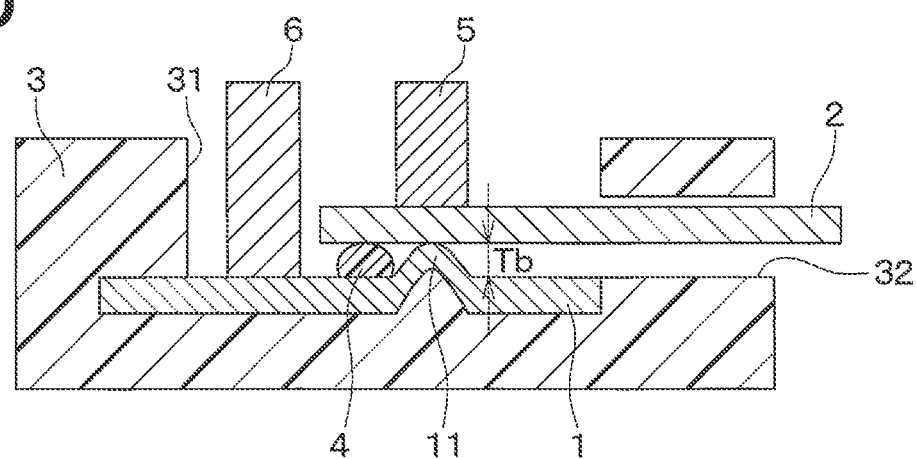
FIG. 3D is a diagram illustrating a cross-sectional view of a step of the manufacturing process of the bonded body subsequent to the step shown in FIG. 3C.

In a step shown in FIG. 3D, the front surface of the first metal piece 1 and the back surface of the second metal piece 2 are welded to each other by an indirect-spot welding. Specifically, inside of the first opening 31, a main electrode 5 is brought into contact with the front surface of the second metal piece 2, that is, the surface of the second metal piece 2 opposite to the first metal piece 1. Further, inside of the first opening 31, a sub electrode 6 is brought into contact with the portion of the front surface of the first metal piece 1 exposed from the second metal piece 2 and the connector case 3. Then, voltage is applied to the main electrode 5 and the sub electrode 6 so as to cause an electric current in the first metal piece 1 and the second metal piece 2. Thus, the electric current concentrates on the protrusion 11, so the protrusion 11 is melted by the Joule's heat and the first metal piece 1 and the second metal piece 2 are bonded to each other by the melted protrusion 11.

In this case, since the protrusion 11 is melted, the height of the protrusion 11 is lowered as compared with the height before being melted. In this case, since the spacer 4 is formed so as to satisfy the relationship of Ta≤Tb in the step shown in FIG. 3B, it is less likely that the bonding between the first metal piece 1 and the second metal piece 2 through the protrusion 11 will be disturbed by the spacer 4.

In the present embodiment, in the first opening 31, the portion of the first metal piece 1 in the longitudinal direction is exposed from the second metal piece 2 and the spacer 4. Therefore, it is possible to perform the indirect-spot welding in the state where the sub electrode 6 is in contact with the portion of the first metal piece 1 exposed from the second metal piece 2 and the spacer 4.

Since the spacer 4 is arranged between the first metal piece 1 and the second metal piece 2, it is less likely that the first metal piece 1 will be in contact with the second metal piece 2 in the region other than the protrusion 11. Thus, poor welding due to dispersion of the electric current can be suppressed. Further, it is possible to enlarge the surface of the main electrode 5 contacting with the second metal piece 2. Therefore, deformation of the main electrode 5 due to the pressurizing and heat generation due to the current concentration to the main electrode 5 can be suppressed.

If the spacer 4 is formed on the second metal piece 2, it is necessary to insert the second metal piece 2 on which the spacer 4 is formed into the second opening 32 of the connector case 3. In this case, it is necessary to increase the width of the second opening 32 for the spacer 4. In the present embodiment, on the other hand, the spacer 4 is formed on the first metal piece 1 that is arranged inside of the connector case 3. Therefore, it is not necessary to increase the width of the second opening 32, and the degree of freedom on designing improves.

Second Embodiment

A second embodiment will be described. In the second embodiment, the arrangement of the spacer 4 is modified from that in the first embodiment. Since the other configurations are similar to those of the first embodiment, only a configuration different from the first embodiment will be described.

Figure 4:
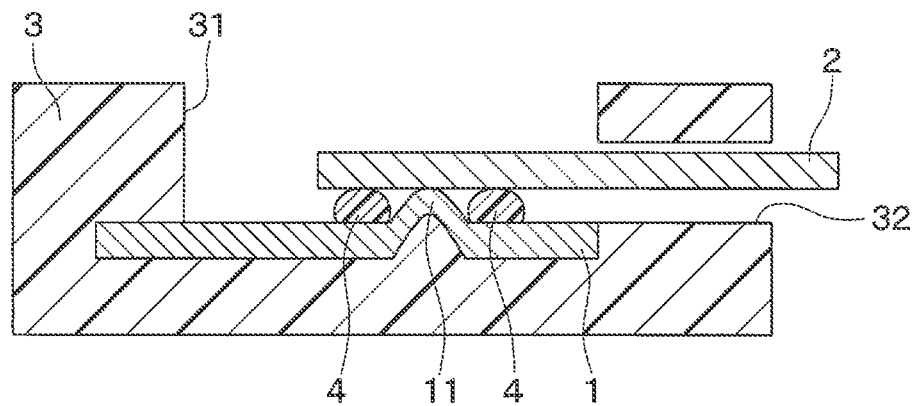
FIG. 4 is a diagram illustrating a cross-sectional view of a bonded body according to a second embodiment.

In the present embodiment, as shown in FIG. 4, spacers 4 are arranged on opposite sides of the protrusion 11 in an in-plane direction of the front surface of the protrusion 11, in particular, in the longitudinal direction of the first metal piece 1.

In the present embodiment, since the spacers 4 are arranged on opposite sides of the protrusion 11, even when the surface of the main electrode 5 contacting with the second metal piece 2 is large, a load can be stably applied to a portion of the second metal piece 2 adjacent to the protrusion 11.

Third Embodiment

A third embodiment will be described. In the third embodiment, the shape of the spacer 4 is modified from that of the second embodiment. Since the other configuration are similar to those of the second embodiment, only a configuration different from the second embodiment will be described.

Figure 5:
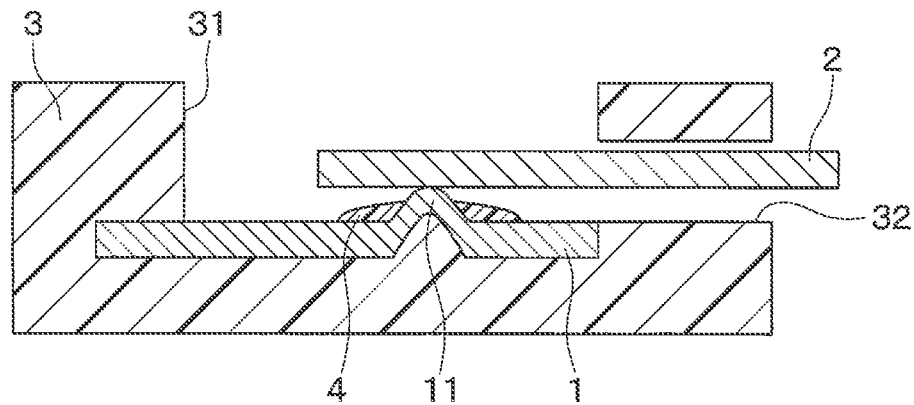
FIG. 5 is a diagram illustrating a cross-sectional view of a bonded body according to a third embodiment.

In the present embodiment, as shown in FIG. 5, the spacer 4 is arranged to surround the protrusion 11 on the front surface of the first metal piece 1, and a side surface of the protrusion 11 is partly covered with the spacer 4.

Also in the present embodiment in which the spacer 4 is formed as described above, a load can be stably applied to the portion of the second metal piece 2 adjacent to the protrusion 11.

Other Embodiments

The present disclosure is not limited to the above embodiments, can be suitably changed within the scope of the present disclosure, and also includes various modifications and deformations within the range of equivalency. The above embodiments relate to each other. Appropriate combinations of the embodiments are possible unless clearly not possible. In each above embodiment, the components forming each above embodiment are not always required unless explicitly stated as essential and clearly considered essential in principle. In each above embodiment, when numerals such as the number, value, amount, and range of the components of the embodiments are described, the numerals are not limiting unless explicitly stated as essential and clearly limited to specific numerals in principle. In each above embodiment, when materials, shapes, or positional relationship of the components are described, the materials, shapes, or positional relationship are not limiting unless explicitly stated and limited to specific materials, shapes, or positional relationship in principle.

Figure 6:
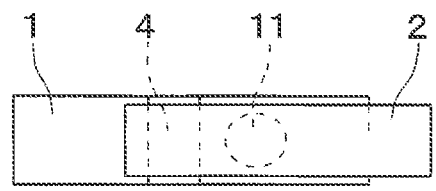
FIG. 6 is a diagram illustrating a plan view of a bonded body according to another embodiment.

For example, in each of the first and second embodiments, the spacer 4 is formed in the shape of dot. Alternatively, as shown in FIG. 6, the spacer 4 may be formed into a straight linear shape perpendicular to the longitudinal direction of the first metal piece 1.

The present disclosure may be used for a direct-spot welding. That is, the connector case 3 may be formed such that the back surface of the first metal piece 1 is exposed from the connector case 3, and the main electrode 5 and the sub electrode 6 are brought into contact with the front surface of the second metal piece 2 and the back surface of the first metal piece 1, respectively, so that the resistance welding may be performed in the state where the protrusion is pressed on both sides in the thickness direction of the first metal piece 1.

What is claimed is:

1. A bonded body comprising:
   a first metal piece having a first surface and a protrusion protruding on the first surface;
   a second metal piece having a second surface, the second surface of the second metal piece being bonded to the first surface of the first metal piece at the protrusion; and
   a spacer having an electrically insulating property, the spacer being provided on the first surface of the first metal piece, and located between the first metal piece and the second metal piece, wherein
   the first metal piece and the second metal piece are arranged to face each other such that a portion of the first surface of the first metal piece outside of the spacer is exposed from the second metal piece, and
   the spacer has a shape of dot.

2. The bonded body according to claim 1, wherein the spacer is bonded on the first surface of the first metal piece.

3. The bonded body according to claim 1, wherein the spacer has a heat resistance temperature equal to or higher than a melting temperature of the protrusion.

4. The bonded body according to claim 1, wherein the spacer has a height equal to or lower than the protrusion.

5. The bonded body according to claim 1, wherein the spacer includes dots formed on opposite sides of the protrusion in an in-plane direction of the first surface of the first metal piece.

6. A method for manufacturing a bonded body in which a first surface of a first member to be welded and a second surface of a second member to be welded are bonded to each other by a resistance welding, the method comprising:
   forming a protrusion on the first surface of the first member;
   forming a spacer on the first surface of the first welded member, the spacer having an electrically insulating property;
   arranging the first member and the second member on top of another such that the second surface of the second member is in contact with the protrusion, the spacer is positioned between the first member and the second member, and a portion of the first surface of the first member outside of the spacer is exposed from the second member; and
   bonding the first member and the second member at the protrusion by melting the protrusion by causing an electric current in each of the first member and the second member, wherein
   the bonding includes placing a first electrode and a second electrode to contact with the first surface of the first member and a first surface of the second member, respectively, to cause the electric current in each of the first member and the second member, the first surface of the second member being opposite to the second surface of the second member.

7. The method according to claim 6, wherein the forming of the spacer includes applying a material of the spacer on the first surface of the first member.

8. The method according to claim 6, wherein the spacer has a heat resistance temperature equal to or higher than a temperature that a portion of the first member where the spacer is formed reaches in the welding.

9. The method according to claim 6, wherein the spacer has a heat resistance temperature equal to or higher than a melting temperature of the protrusion.

10. The method according to claim 6, wherein the spacer has a height equal to or less than a height of the protrusion that is melted in the welding.

11. The method according to claim 6, wherein the forming of the spacer includes arranging a material of the spacer on opposite sides of the protrusion in an in-plane direction of the first surface of the first member.

12. The method according to claim 11, wherein the forming of the spacer includes arranging a material of the spacer to surrounding the protrusion.

13. The method according to claim 6, wherein the forming of the spacer includes arranging a material of the spacer in a shape of dot.

14. The method according to claim 6, wherein the forming of the spacer includes arranging a material of the spacer in a linear shape.

* * * * *